(12) United States Patent
Sato

(10) Patent No.: US 10,170,426 B2
(45) Date of Patent: Jan. 1, 2019

(54) MANUFACTURING METHOD OF WIRING STRUCTURE AND WIRING STRUCTURE

(71) Applicant: FUJITSU LIMITED, Kawasaki-shi, Kanagawa (JP)

(72) Inventor: Motonobu Sato, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 40 days.

(21) Appl. No.: 14/661,585

(22) Filed: Mar. 18, 2015

(65) Prior Publication Data

US 2016/0276281 A1    Sep. 22, 2016

(51) Int. Cl.

| | |
|---|---|
| *H01L 23/48* | (2006.01) |
| *H01L 29/40* | (2006.01) |
| *H01L 23/532* | (2006.01) |
| *H01L 21/768* | (2006.01) |
| *H01L 23/528* | (2006.01) |
| *H01L 23/485* | (2006.01) |

(52) U.S. Cl.
CPC .. *H01L 23/53276* (2013.01); *H01L 21/76802* (2013.01); *H01L 21/76877* (2013.01); *H01L 21/76883* (2013.01); *H01L 21/76886* (2013.01); *H01L 23/485* (2013.01); *H01L 23/528* (2013.01); *H01L 23/53295* (2013.01); *H01L 21/7681* (2013.01); *H01L 2221/1094* (2013.01)

(58) Field of Classification Search
CPC .......... H01L 29/1606; H01L 21/76877; H01L 23/53295; H01L 21/76802

USPC .......................... 257/750, 748, 758
See application file for complete search history.

(56) References Cited

U.S. PATENT DOCUMENTS

| | | | | |
|---|---|---|---|---|
| 9,076,795 | B1* | 7/2015 | Saito | ................ H01L 23/53276 |
| 2011/0006425 | A1* | 1/2011 | Wada | ................ H01L 21/76807 |
| | | | | 257/750 |
| 2011/0233779 | A1* | 9/2011 | Wada | ..................... B82Y 10/00 |
| | | | | 257/751 |
| 2012/0080661 | A1* | 4/2012 | Saito | ................ H01L 21/76876 |
| | | | | 257/29 |

FOREIGN PATENT DOCUMENTS

| | | |
|---|---|---|
| JP | 2009-070911 A | 4/2009 |
| JP | 2011-23420 A1 | 2/2011 |
| JP | 2012-074682 A | 4/2012 |

OTHER PUBLICATIONS

Japanese Patent Application No. 2013-195699: Notification of Reasons for Refusal dated Feb. 7, 2017.

\* cited by examiner

*Primary Examiner* — S. V. Clark

(74) *Attorney, Agent, or Firm* — Kratz, Quintos & Hanson, LLP

(57) ABSTRACT

A trench is formed in an insulating film, carbon is formed on the insulating film to fill an inside of the trench, a catalytic material is formed on the carbon, heat treatment is performed on the carbon to turn the carbon into graphenes which are stacked in a plurality of layers, and the catalytic material and a part of the graphenes on the insulating film are removed to make the graphenes remain only in the trench.

4 Claims, 10 Drawing Sheets

MANUFACTURING METHOD OF WIRING STRUCTURE AND WIRING STRUCTURE

FIELD

The embodiments discussed herein are directed to a manufacturing method of a wiring structure, and the wiring structure.

BACKGROUND

In a semiconductor device, as materials of a wiring, a plug, a via, a through via (TSV) and the like, metal materials of W, Cu, Al, and the like are mainly used. As an alternative to these materials, there can be cited a carbon-based material such as graphene as a material having a low resistivity, a high current density resistance, and a high thermal conductivity.

As a method of forming graphene, there is a method in which the graphene is grown on or under a catalytic metal by using a CVD method or a sputtering method. Generally, as a method of performing wiring processing of the grown graphene, a method in which the graphene is transferred to a semiconductor substrate or the like, and thereafter, etching is performed by masking a processing pattern, is conducted.

Patent Document 1 discloses a wiring formed by filling an inside of a trench of an insulating film with a catalytic layer, a graphene layer and a core material via a base layer.

Patent Document 1: Japanese Laid-open Patent Publication No. 2011-23420

The method of transferring the graphene to the semiconductor substrate or the like, has a problem that the number of processes is large, since the transfer process is requisite.

The method in Patent Document 1 has a problem that, since the base layer, the catalytic layer, and the core material are used together with the graphene layer as components of the wiring, it is not possible to sufficiently utilize excellent low electric resistance and low thermal resistance of the graphene.

SUMMARY

A manufacturing method of a wiring structure of the present embodiment includes: forming a trench in an insulating film; forming carbon on the insulating film to fill an inside of the trench; forming a catalytic material on the carbon; performing heat treatment on the carbon to turn the carbon into graphenes which are stacked in a plurality of layers; and removing the catalytic material and a part of the graphenes on the insulating film, to make the graphenes remain only in the trench.

A wiring structure of the present embodiment includes: an insulating film in which a trench is formed; and a conductive material which fills an inside of the trench, in which the conductive material is made of stacked plural layers of graphenes formed in a direction along a bottom surface of the trench.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, a MOS transistor of a semiconductor device will be exemplified as an electronic device to which a wiring structure of the present embodiment is applied. The wiring structure and a graphene deposition method of the present embodiment can be applied to various electronic devices such as another semiconductor device like a semiconductor memory, to a rewiring in a WLP (Wafer Level Package), a RDL (redistribution layout) and the like, and to an interposer, a TIM (Thermal Interface Material) and the like as an application for heat release.

First Embodiment

FIG. 1A to FIG. 6C are schematic sectional views illustrating a manufacturing method of a semiconductor device according to a first embodiment in order of processes. In the present embodiment, a single damascene method is applied to a formation of a wiring structure.

Figure 1A:
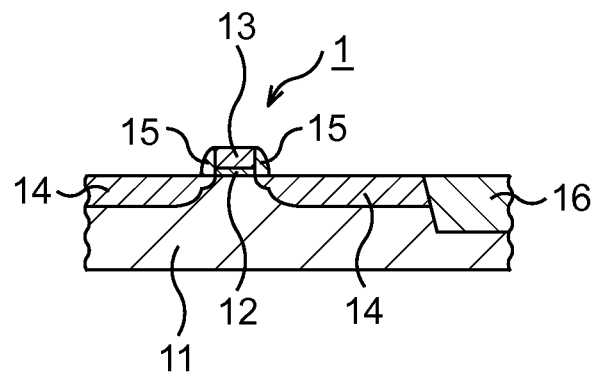
FIG. 1A, FIG. 1B, and FIG. 1C are schematic sectional views illustrating a manufacturing method of a semiconductor device according to a first embodiment in order of processes.

First, as illustrated in FIG. 1A, a MOS transistor 1 is formed on a semiconductor substrate 11.

The MOS transistor 1 includes a gate electrode 13 formed on the semiconductor substrate 11 via a gate insulating film 12, and source/drain regions 14 on both sides of the gate electrode 13.

The gate electrode 13 is formed, in an active region demarcated by element isolation structures 16 (STI (Shallow Trench Isolation), for example) on the semiconductor substrate 11 being a Si substrate, for example, via the gate insulating film 12, with the use of polycrystalline silicon or the like as a material. On both sides of the gate electrode 13, sidewalls 15 made of an insulating material are formed by an etch-back method, for example.

The source/drain regions 14 are formed by introducing P-type impurities (boron or the like) or N-type impurities (phosphorus, arsenic or the like) into the active regions on the both sides of the gate electrode 13.

Figure 1B:
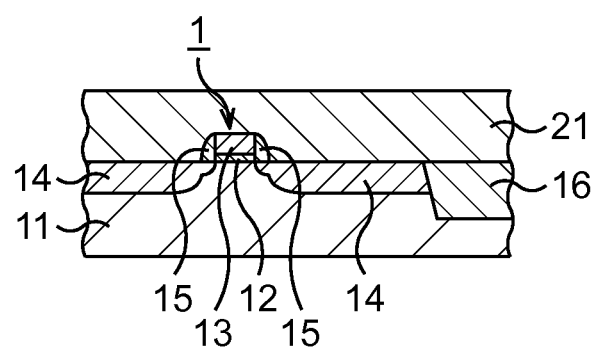

Subsequently, an interlayer insulating film 21 is formed, as illustrated in FIG. 1B.

Specifically, an insulating material which is, for example, a silicon oxide is deposited, with the use of a CVD method or the like, on the semiconductor substrate 11 so as to cover the MOS transistor 1. Accordingly, the interlayer insulating film 21 covering the MOS transistor 1 is formed to have a thickness of about 300 nm, for example.

Figure 1C:
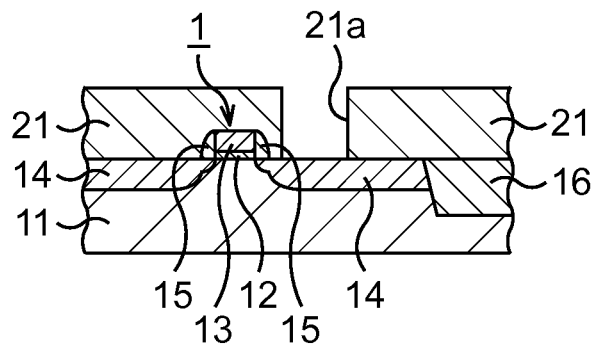

Subsequently, a connection hole 21a is formed in the interlayer insulating film 21, as illustrated in FIG. 1C.

Specifically, an opening is formed in the interlayer insulating film 21 by lithography and dry etching. Accordingly, the connection hole 21a which exposes a part of a surface of the source/drain regions 14, for example, is formed.

Figure 2A:
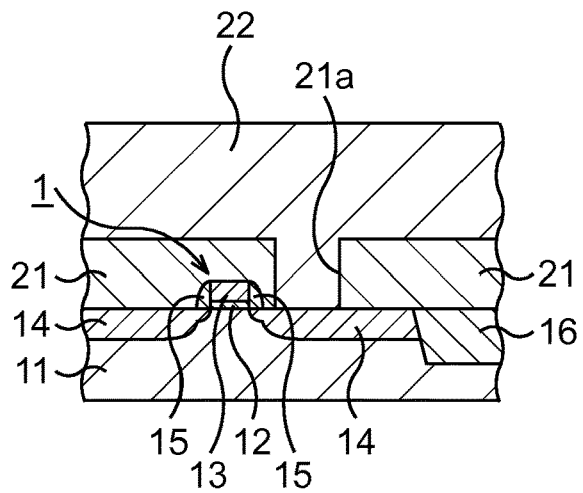
FIG. 2A, FIG. 2B, and FIG. 2C are schematic sectional views illustrating the manufacturing method of the semiconductor device according to the first embodiment in order of processes continued from FIG. 1C.

Subsequently, carbon 22 is deposited, as illustrated in FIG. 2A.

Specifically, the carbon 22 is deposited on the interlayer insulating film 21 to have a thickness of about 300 nm, for example, by a directive sputtering method or the like, so as to fill the connection hole 21a. Note that it is also possible to use a vapor deposition method, instead of using the sputtering method.

Figure 2B:
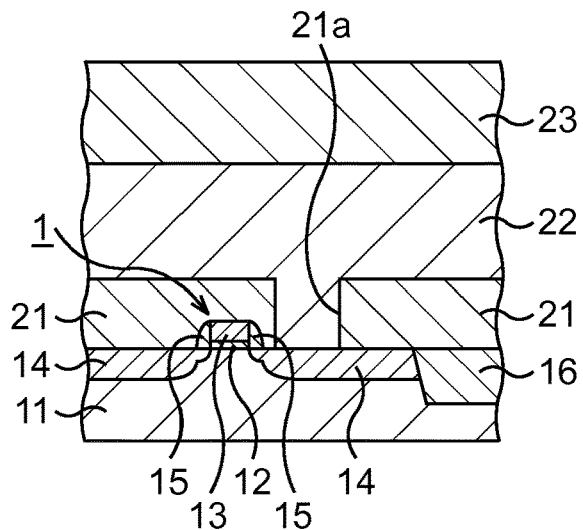

Subsequently, a catalytic metal 23 is deposited, as illustrated in FIG. 2B.

Specifically, Co, Ni, Pt, Fe or the like being a metal to be a catalyst in graphene formation, for example, Co is deposited on the carbon 22 to have a thickness of about 500 nm, for example, by the sputtering method or the like. Consequently, the catalytic metal 23 is formed on the carbon 22.

Figure 2C:
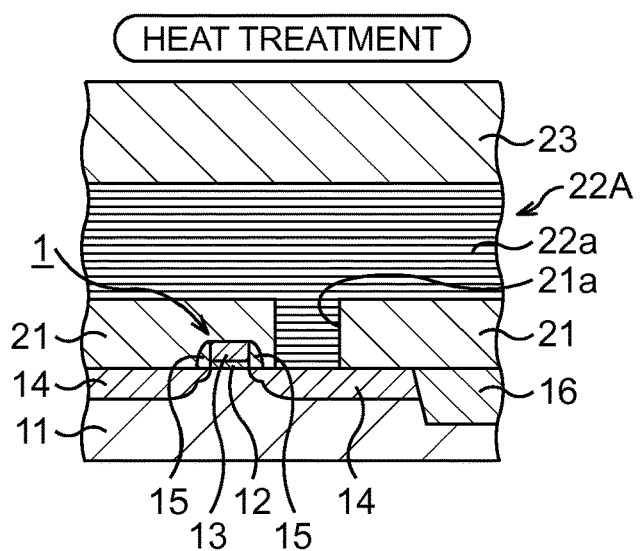

Subsequently, a multilayer graphene 22A is formed, as illustrated in FIG. 2C.

Specifically, the carbon 22 is subjected to heat treatment under a condition where a processing temperature is set to 600° C. or more, which is set to about 1200° C. in this case, and a processing time is set to from about 1 second to about 1 hour, which is set to about 10 seconds in this case by depending on the processing temperature. Accordingly, the carbon 22 is turned into the multilayer graphene 22A formed of graphenes 22a which are stacked in a plurality of layers. The multilayer graphene 22A is formed in a state where the graphenes 22a are grown in a horizontal direction along a contact surface with the catalytic metal 23 (along a bottom surface of the connection hole 21a), and sheet-shaped graphenes 22a are stacked in the plurality of layers. If the processing temperature is lower than about 600° C., a proportion of diamond-like carbon becomes large, and if the processing temperature is higher than about 800° C., a proportion of the multilayer graphene becomes large. Because of a temperature dependence of a diffusion time of the catalytic metal and the carbon, the processing time is increased under a low temperature, and the processing time is reduced under a high temperature. Further, in order to suppress an aggregation of film, it is desirable that as the temperature in the treatment increases, a film thickness is increased, and as the film thickness is increased, the processing time is increased, so that an optimization has to be performed. Further, a thickness of the catalytic metal 23 is desirably set to fall within a range from a thickness equivalent to a thickness of the carbon 22 to a thickness which is twice the thickness of the carbon 22. By this method, the multilayer graphene 22A having a resistivity corresponding to that of HOPG can be obtained.

Figure 3A:
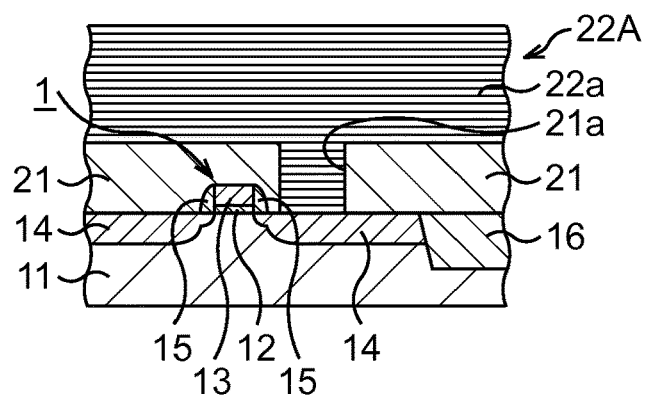
FIG. 3A, FIG. 3B, and FIG. 3C are schematic sectional views illustrating the manufacturing method of the semiconductor device according to the first embodiment in order of processes continued from FIG. 2C.

Subsequently, the catalytic metal 23 is removed, as illustrated in FIG. 3A.

Specifically, wet etching is performed on the catalytic metal 23 by using, for example, an aqueous solution of $FeCl_3$, or a dilute aqueous solution of HCl, to thereby remove the catalytic metal 23. Note that the removal of the catalytic metal 23 may also be omitted since the catalytic metal 23 is removed also in a process of intercalation or a process of planarization to be described later.

Figure 3B:
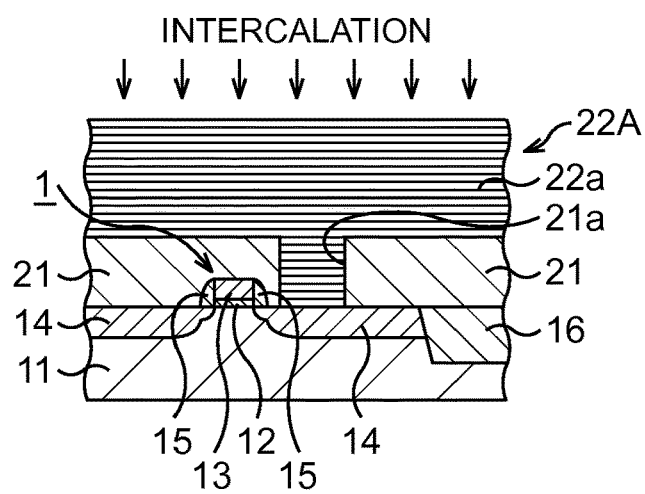

Subsequently, the intercalation (doping) is performed on the multilayer graphene 22A, as illustrated in FIG. 3B.

Specifically, the intercalation of molecules of a different kind is performed on the multilayer graphene 22A. The molecules of the different kind to be intercalated are not particularly limited, but, it is desirable to use at least one kind selected from $FeCl_3$, K, Rb, Cs, Li, $HNO_3$, $SbCl_5$, $SbF_5$, $Br_2$, $AlCl_3$, $NiCl_2$, $AsF_5$, and $AuCl_3$. Here, $FeCl_3$ is used, for example. Through this intercalation, it is possible to greatly decrease an electric resistance and a thermal resistance of the multilayer graphene 22A, and the resistivity of the multilayer graphene 22A can be decreased, from the resistivity corresponding to that of HOPG to the resistivity corresponding to that of Cu.

Figure 3C:
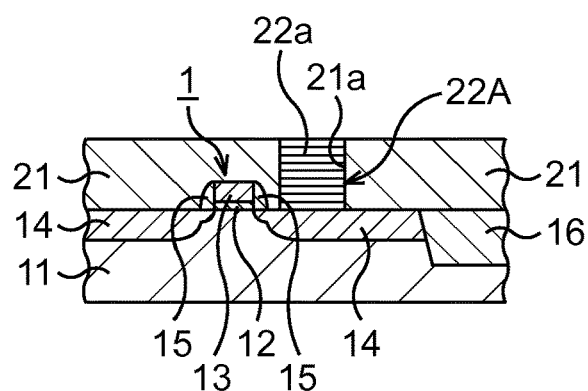

Subsequently, a part on the interlayer insulating film 21 is subjected to planarization, as illustrated in FIG. 3C.

Specifically, with the use of a Chemical-Mechanical Polishing (CMP), for example, the multilayer graphene 22A is polished by using a surface of the interlayer insulating film 21 as a polishing stopper, to thereby perform the planarization on the part on the interlayer insulating film 21. Through this planarization, the multilayer graphene 22A remains only in the connection hole 21a. Consequently, there is formed a graphene plug 24 made by filling the inside of the connection hole 21a with the multilayer graphene 22A formed by the stacked graphenes 22a in the horizontal direction.

An adhesiveness of the multilayer graphene 22A is maintained in the connection hole 21a. For this reason, the graphene plug 24 is formed in a manner that the multilayer graphene 22A is directly filled in the connection hole 21a with no barrier metal or the like provided therebetween. By employing this configuration, the graphene plug 24 is formed only of the multilayer graphene 22A (and the intercalant) without using another structure material (barrier metal or the like) which causes an increase in the electric resistance and the thermal resistance, resulting in that the electric resistance and the thermal resistance of the graphene plug 24 can be decreased as much as possible.

Note that it is also possible that, in accordance with a formation state of the wiring structure, the multilayer graphene 22A is formed in the connection hole 21a via the barrier metal or a contact metal.

Figure 4A:
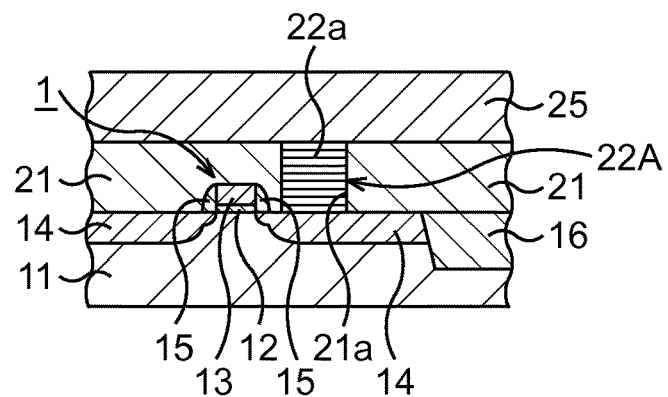
FIG. 4A, FIG. 4B, and FIG. 4C are schematic sectional views illustrating the manufacturing method of the semiconductor device according to the first embodiment in order of processes continued from FIG. 3C.

Subsequently, an interlayer insulating film 25 is formed, as illustrated in FIG. 4A.

Specifically, an insulating material which is, for example, a silicon oxide is deposited, with the use of the CVD method or the like, on the interlayer insulating film 21 including a part on the graphene plug 24 so as to cover the MOS transistor 1. Consequently, the interlayer insulating film 25 covering the part on the graphene plug 24 is formed to have a thickness of about 300 nm, for example.

Figure 4B:
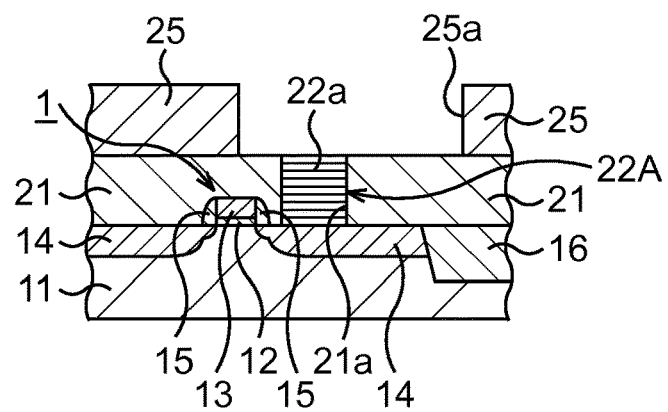

Subsequently, a wiring trench 25a is formed in the interlayer insulating film 25, as illustrated in FIG. 4B.

Specifically, an opening is formed in the interlayer insulating film 25 by the lithography and the dry etching. Accordingly, the wiring trench 25a which exposes a surface of the graphene plug 24, for example, is formed.

Figure 4C:
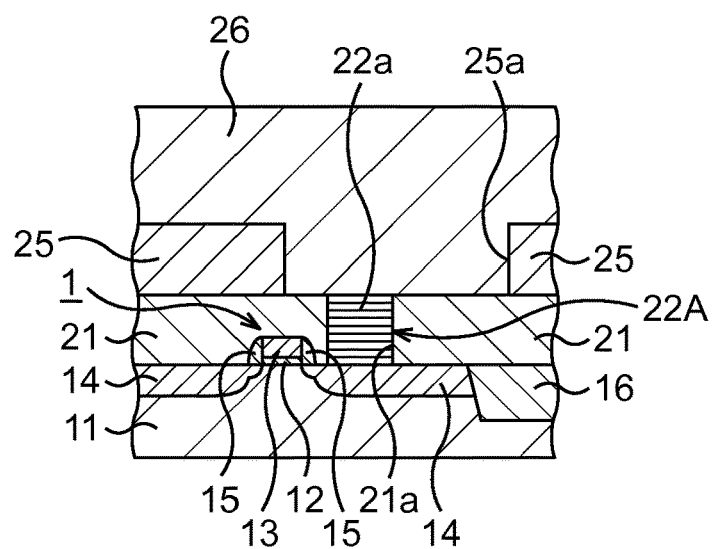

Subsequently, carbon 26 is deposited, as illustrated in FIG. 4C.

Specifically, the carbon 26 is deposited on the interlayer insulating film 25 to have a thickness of about 300 nm, for example, by the directive sputtering method or the like, so as to fill the wiring trench 25a. Note that it is also possible to use the vapor deposition method, instead of using the sputtering method.

Figure 5A:
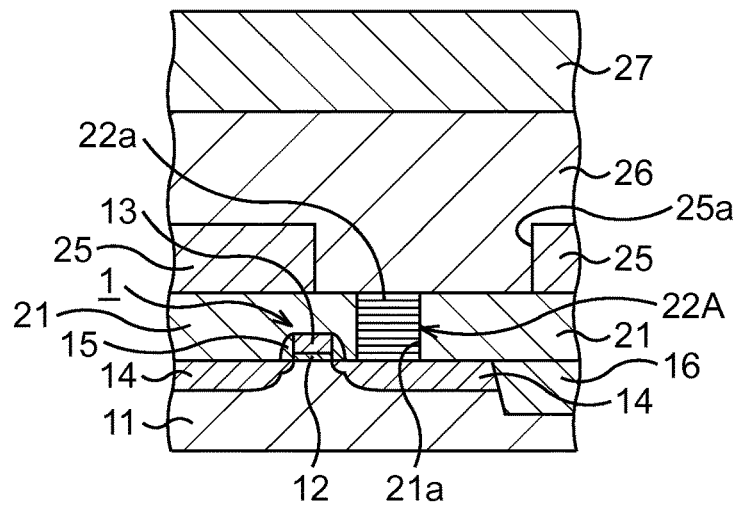
FIG. 5A, FIG. 5B, and FIG. 5C are schematic sectional views illustrating the manufacturing method of the semiconductor device according to the first embodiment in order of processes continued from FIG. 4C.

Subsequently, a catalytic metal 27 is deposited, as illustrated in FIG. 5A.

Specifically, Co, Ni, Pt, Fe or the like being a metal to be a catalyst in graphene formation, for example, Co is deposited on the carbon 26 to have a thickness of about 500 nm, for example, by the sputtering method or the like. Consequently, the catalytic metal 27 is formed on the carbon 26.

Figure 5B:
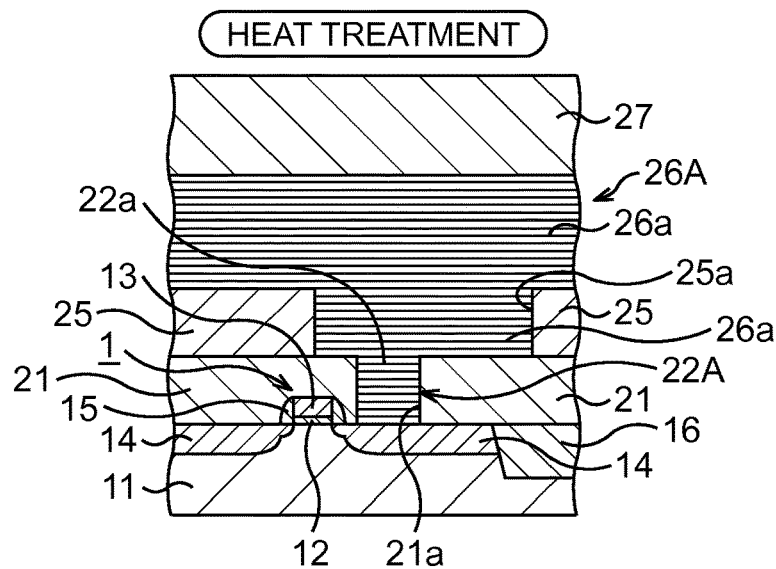

Subsequently, a multilayer graphene 26A is formed, as illustrated in FIG. 5B.

Specifically, the carbon 26 is subjected to heat treatment under a condition where a processing temperature is set to 600° C. or more, which is set to about 1200° C. in this case, and a processing time is set to from about 1 second to about 1 hour, which is set to about 10 seconds in this case by depending on the processing temperature. Accordingly, the carbon 26 is turned into the multilayer graphene 26A formed of graphenes 26a which are stacked in a plurality of layers. The multilayer graphene 26A is formed in a state where the graphenes 26a are grown in the horizontal direction along a contact surface with the catalytic metal 27 (along a bottom surface of the wiring trench 25a), and sheet-shaped graphenes 26a are stacked in the plurality of layers. By this method, the multilayer graphene 26A having a resistivity corresponding to that of HOPG can be obtained.

Figure 5C:
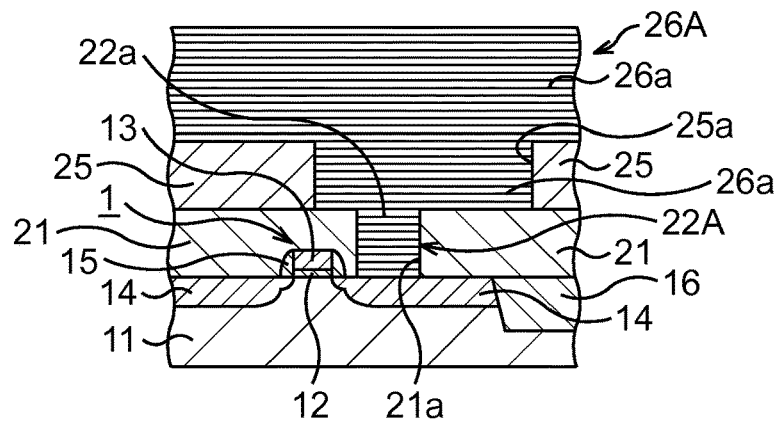

Subsequently, the catalytic metal 27 is removed, as illustrated in FIG. 5C.

Specifically, the wet etching is performed on the catalytic metal 27 by using, for example, the aqueous solution of $FeCl_3$, or the dilute aqueous solution of HCl, to thereby remove the catalytic metal 27. Note that the removal of the catalytic metal 27 may also be omitted since the catalytic metal 27 is removed also in a process of intercalation or a process of planarization to be described later.

Figure 6A:
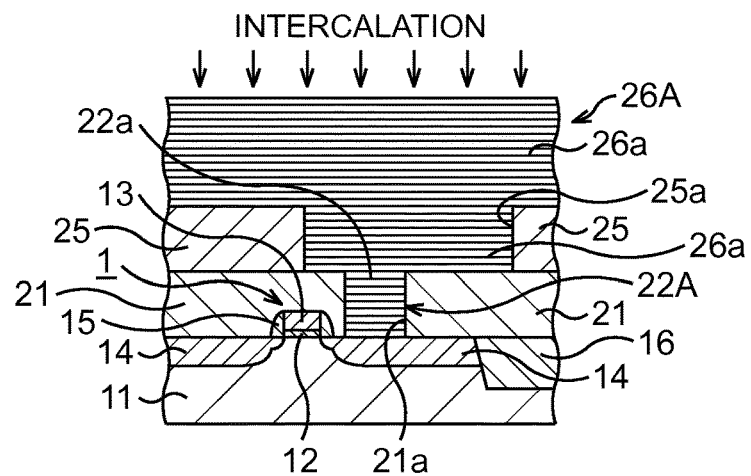
FIG. 6A, FIG. 6B, and FIG. 6C are schematic sectional views illustrating the manufacturing method of the semiconductor device according to the first embodiment in order of processes continued from FIG. 5C.

Subsequently, the intercalation (doping) is performed on the multilayer graphene 26A, as illustrated in FIG. 6A.

Specifically, the intercalation of molecules of a different kind is performed on the multilayer graphene 26A. The molecules of the different kind to be intercalated are not particularly limited, but, it is desirable to use at least one kind selected from $FeCl_3$, K, Rb, Cs, Li, $HNO_3$, $SbCl_5$, $SbF_5$, $Br_2$, $AlCl_3$, $NiCl_2$, $AsF_5$, and $AuCl_3$. Here, $FeCl_3$ is used, for example. Through this intercalation, it is possible to greatly decrease an electric resistance and a thermal resistance of the multilayer graphene 26A, and the resistivity of the multilayer graphene 26A can be decreased, from the resistivity corresponding to that of HOPG to the resistivity corresponding to that of Cu.

Figure 6B:
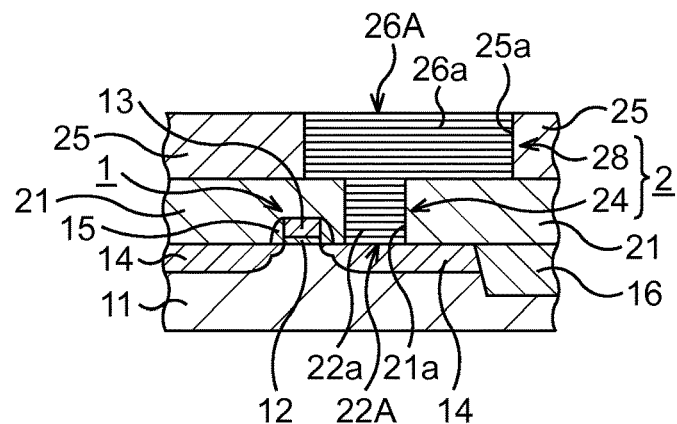

Subsequently, a part on the interlayer insulating film 25 is subjected to planarization, as illustrated in FIG. 6B.

Specifically, with the use of the CMP, for example, the multilayer graphene 26A is polished by using a surface of the interlayer insulating film 25 as a polishing stopper, to thereby perform the planarization on the part on interlayer insulating film 25. Through this planarization, the multilayer graphene 26A remains only in the wiring trench 25a. Consequently, there is formed a graphene wiring 28 made by filling the inside of the wiring trench 25a with the multilayer graphene 26A formed of the stacked sheet-shaped graphenes 26a in the horizontal direction.

By the graphene plug 24 and the graphene wiring 28 connected to the graphene plug 24, a wiring structure 2 is formed.

An adhesiveness of the multilayer graphene 26A is maintained in the wiring trench 25a. For this reason, the graphene wiring 28 is formed in a manner that the multilayer graphene 26A is directly filled in the wiring trench 25a with no barrier metal or the like provided therebetween. By employing this configuration, the graphene wiring 28 is formed only of the multilayer graphene 26A (and the intercalant) without using another structure material (barrier metal or the like) which causes an increase in the electric resistance and the thermal resistance, resulting in that the electric resistance and the thermal resistance of the graphene wiring 28 can be decreased as much as possible.

Note that it is also possible that, in accordance with a formation state of the wiring structure, the multilayer graphene 26A is formed in the wiring trench 25a via the barrier metal or the contact metal.

Figure 6C:
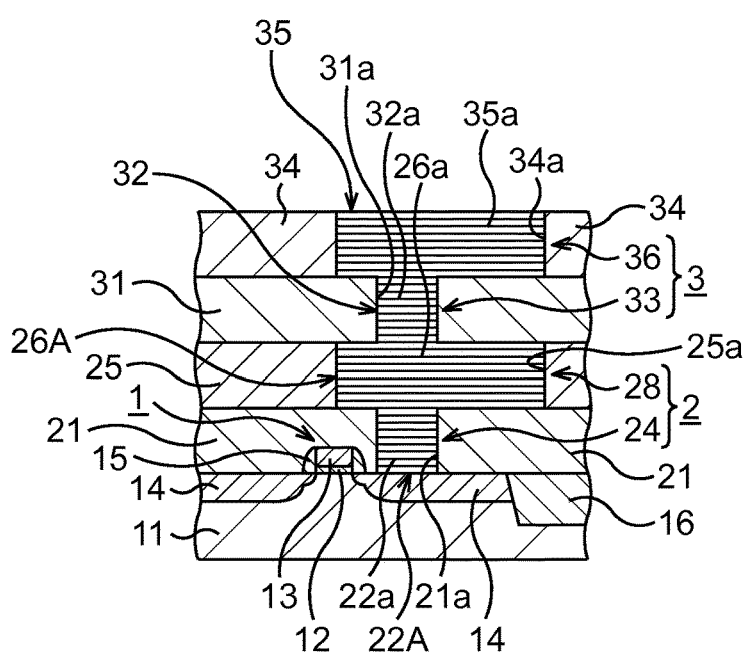

Subsequently, on the wiring structure 2, a wiring structure 3 to be connected to the wiring structure 2 is formed, as illustrated in FIG. 6C.

The wiring structure 3 is formed in a similar manner to that of the wiring structure 2.

Specifically, an interlayer insulating film 31 is formed on the interlayer insulating film 25, a connection hole 31a is formed in the interlayer insulating film 31, carbon which fills the connection hole 31a is formed on the interlayer insulating film 31, a catalytic metal is formed on the carbon, a multilayer graphene 32 is formed by performing heat treatment on the carbon, and a removal of the catalytic metal and the CMP of the multilayer graphene 32 are carried out. Consequently, there is formed a graphene via 33 made by filling the inside of the connection hole 31a with the multilayer graphene 32 formed of stacked sheet-shaped graphenes 32a in the horizontal direction.

An interlayer insulating film 34 is formed on the interlayer insulating film 31, a wiring trench 34a is formed in the interlayer insulating film 34, carbon which fills the wiring trench 34a is formed on the interlayer insulating film 34, a catalytic metal is formed on the carbon, a multilayer graphene 35 is formed by performing heat treatment on the carbon, and a removal of the catalytic metal and the CMP of the multilayer graphene 35 are carried out. Consequently, there is formed a graphene wiring 36 made by filling the inside of the wiring trench 34a with the multilayer graphene 35 formed of stacked graphenes 35a in the horizontal direction.

By the graphene via 33 and the graphene wiring 36 connected to the graphene via 33, the wiring structure 3 is formed.

Hereinafter, on the wiring structure 3, wiring structures to be connected to the wiring structure 3 are sequentially formed by a necessary number, in a similar manner to that of the wiring structure 3, to thereby realize a multilayer wiring structure. Consequently, the semiconductor device is formed.

Note that in the present embodiment, the case where the multilayer wiring structure is directly formed on the MOS transistor is exemplified, but, it is also possible to design such that the multilayer wiring structure is formed in advance, and is connected to a substrate on which the MOS transistor is formed, through a transfer or the like.

As described above, according to the present embodiment, it becomes possible to easily and securely obtain the simple wiring which utilizes the excellent low electric resistance and low thermal resistance of graphene as much as possible, and the multilayer wiring structure with high reliability is realized.

MODIFIED EXAMPLE

Hereinafter, various modified examples of the first embodiment will be described.

The first embodiment describes that each of the graphene plug 24 and the graphene wiring 28 configuring the wiring structure 2, and each of the graphene via 33 and the graphene wiring 36 configuring the wiring structure 3 is formed of the multilayer graphene with the use of the single damascene method. In the following modified examples, a case where each of the graphene plug 24 of the wiring structure 2, and the graphene via 33 of the wiring structure 3 is formed of another conductive material, will be exemplified.

Modified Example 1

In the present example, a case where each of the plug and the via of the wiring structures is formed of a metal material, will be exemplified.

Figure 7:
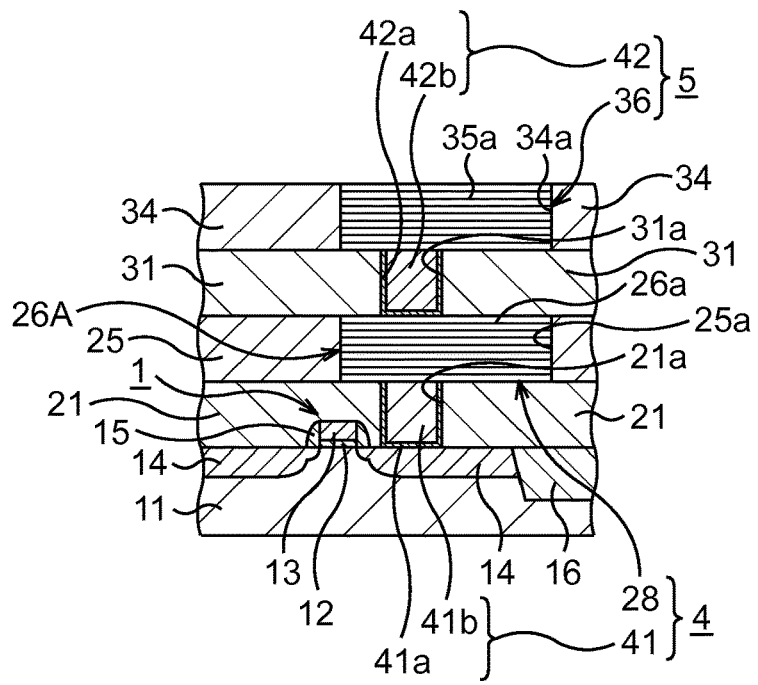
FIG. 7 is a schematic sectional view illustrating a configuration of a semiconductor device according to a modified example 1 of the first embodiment.

FIG. 7 is a schematic sectional view illustrating a configuration of a semiconductor device according to a modified example 1 of the first embodiment, and corresponds to FIG. 6C in the first embodiment. Note that composing members and the like similar to those of the first embodiment are denoted by the same reference numerals, and detailed explanation thereof will be omitted.

In the semiconductor device according to the present example, a wiring structure 4 which includes a W plug 41 and the graphene wiring 28, and a wiring structure 5 which includes a Cu via 42 and the graphene wiring 36, are formed.

In order to form the W plug 41, tungsten (W) 41b is first deposited in the connection hole 21a of the interlayer insulating film 21 by using, for example, the sputtering method, the CVD method or the like, via TiN, for example, being a barrier metal 41a. Subsequently, the barrier metal 41a and the W 41b on the interlayer insulating film 21 are subjected to planarization with the use of the CMP or the like. Consequently, there is formed the W plug 41 made by filling the inside of the connection hole 21a of the interlayer insulating film 21 with the W 41b via the barrier metal 41a.

In order to form the Cu via 42, Cu 42b is first grown in the connection hole 31a of the interlayer insulating film 31 with the use of a plating method or the like, for example, via TiN, for example, being a barrier metal 42a. Subsequently, the barrier metal 42a and the Cu 42b on the interlayer insulating film 31 are subjected to planarization with the use of the CMP or the like. Consequently, there is formed the Cu via 42 made by filling the inside of the connection hole 31a of the interlayer insulating film 31 with the Cu 42b via the barrier metal 42a.

According to the present example, it becomes possible to easily and securely obtain the simple wiring which utilizes the excellent low electric resistance and low thermal resistance of graphene as much as possible, and the multilayer wiring structure with high reliability is realized.

Modified Example 2

In the present example, a case where each of the plug and the via of the wiring structures is formed of carbon nanotubes (CNTs), will be exemplified.

Figure 8:
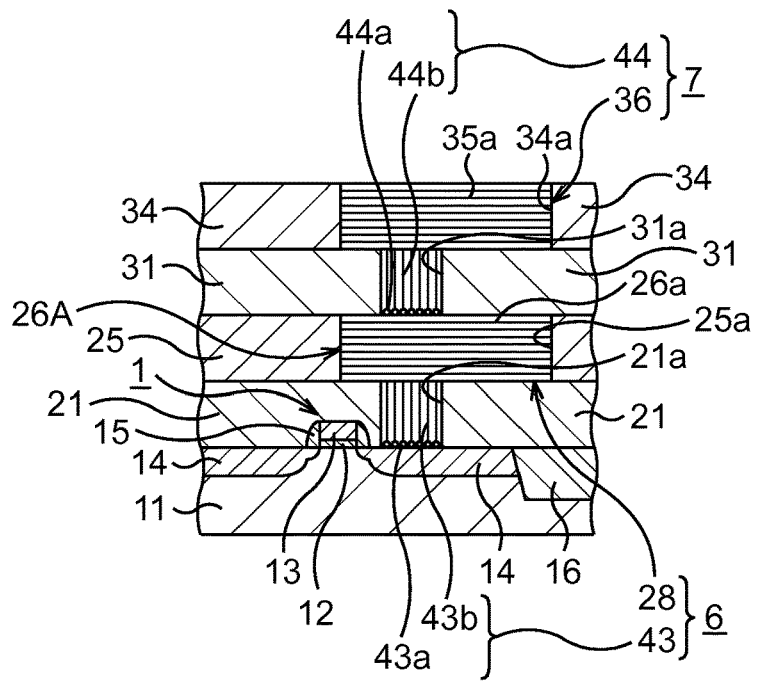
FIG. 8 is a schematic sectional view illustrating a configuration of a semiconductor device according to a modified example 2 of the first embodiment.

FIG. 8 is a schematic sectional view illustrating a configuration of a semiconductor device according to a modified example 2 of the first embodiment, and corresponds to FIG. 6C in the first embodiment. Note that composing members and the like similar to those of the first embodiment are denoted by the same reference numerals, and detailed explanation thereof will be omitted.

In the semiconductor device according to the present example, a wiring structure 6 which includes a CNT plug 43 and the graphene wiring 28, and a wiring structure 7 which includes a CNT via 44 and the graphene wiring 36, are formed.

In order to form the CNT plug 43, catalytic fine particles 43a made of Co or the like are first deposited, as a catalytic material, in the connection hole 21a of the interlayer insulating film 21 with the use of a vacuum vapor deposition method or the like. Subsequently, a growth process of CNTs is carried out with the use of a thermal CVD method, for example, by setting an application direction of electric field to a direction perpendicular to a surface of the substrate. Accordingly, CNTs 43b are formed so as to rise from the catalytic fine particles 43a which exist on the bottom surface of the connection hole 21a. Tip portions of the CNTs 43b are subjected to planarization by the CMP or the like. Consequently, there is formed the CNT plug 43 made by forming the CNTs 43b which rise from the catalytic fine particles 43a in the connection hole 21a.

In order to form the CNT via 44, catalytic fine particles 44a made of Co or the like are first deposited, as a catalytic material, in the connection hole 31a of the interlayer insulating film 31 with the use of the vacuum vapor deposition method or the like. Subsequently, a growth process of CNTs is carried out with the use of the thermal CVD method, for example, by setting an application direction of electric field to a direction perpendicular to the surface of the substrate. Accordingly, CNTs 44b are formed so as to rise from the catalytic fine particles 44a which exist on a bottom surface of the connection hole 31a. Tip portions of the CNTs 44b are subjected to planarization by the CMP or the like. Consequently, there is formed the CNT via 44 made by forming the CNTs 44b which rise from the catalytic fine particles 44a in the connection hole 31a.

Note that it is also possible to form the CNTs 43b and 44b through implantation, instead of forming the CNTs 43b and 44b through growth as described above.

Specifically, a Si substrate or the like having an oxide film formed on a surface thereof is used, CNTs are grown to be formed on the Si substrate, upper ends of the CNTs are planarized, a transfer support film is formed on the planarized portion, and the Si substrate is removed. The CNTs of the transfer support film are made to face the connection hole 21a (31a) of the interlayer insulating film 21 (31), and a volatile solvent is applied to a portion between the CNTs and the connection hole which are faced each other. When the applied volatile solvent is dried, the interlayer insulating film 21 (31) comes into close contact with the CNTs. The tip portions of the CNTs are inserted into the connection hole 21a (31a), and are connected to the bottom surface of the connection hole 21a (31a). The transfer support film and unnecessary CNTs are removed by the polishing or the like.

According to the present example, it becomes possible to easily and securely obtain the simple wiring which utilizes the excellent low electric resistance and low thermal resistance of graphene and CNT as much as possible, and the multilayer wiring structure with high reliability is realized.

Second Embodiment

FIG. 9A to FIG. 11C are schematic sectional views illustrating a manufacturing method of a semiconductor device according to a second embodiment in order of processes. In the present embodiment, a dual damascene method is applied to a formation of a wiring structure. Note that composing members and the like similar to those of the first embodiment are denoted by the same reference numerals, and detailed explanation thereof will be omitted.

First, the MOS transistor 1 is formed on the semiconductor substrate 11, in a similar manner to that of FIG. 1A in the first embodiment.

Figure 9A:
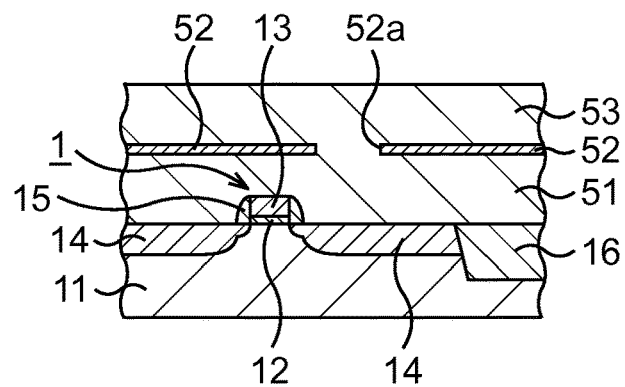
FIG. 9A, FIG. 9B, and FIG. 9C are schematic sectional views illustrating a manufacturing method of a semiconductor device according to a second embodiment in order of processes.

Subsequently, an interlayer insulating film 51, an etching stopper film 52, and an interlayer insulating film 53 are sequentially formed, as illustrated in FIG. 9A.

Specifically, an insulating material which is, for example, a silicon oxide is first deposited on the semiconductor substrate 11 so as to cover the MOS transistor 1, with the use of the CVD method or the like. Accordingly, the interlayer insulating film 51 covering the MOS transistor 1 is formed to have a thickness of about 300 nm, for example.

Next, silicon carbide, for example, is deposited on the interlayer insulating film 51. Accordingly, the etching stopper film 52 is formed to have a thickness of about 30 nm, for example, on the interlayer insulating film 51.

Next, an opening is formed in the etching stopper film 52 by the lithography and the dry etching. Accordingly, an opening 52a for forming a connection hole in the interlayer insulating film 51 is formed in the etching stopper film 52.

Next, an insulating material which is, for example, a silicon oxide is deposited on the etching stopper film 52. Accordingly, the interlayer insulating film 53 is formed to have a thickness of about 300 nm, for example, on the etching stopper film 52.

Figure 9B:
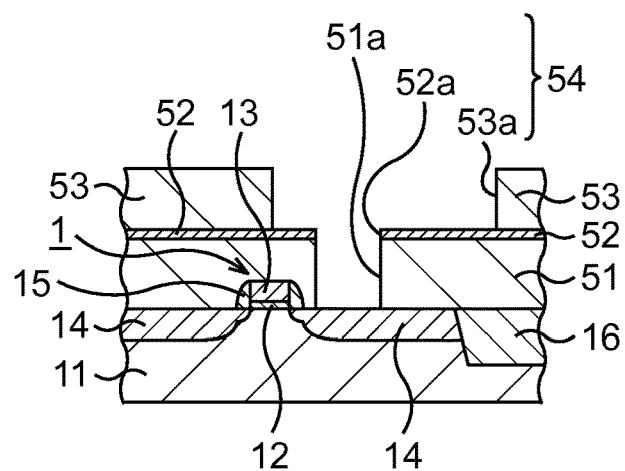

Subsequently, a wiring structure trench 54 is formed in the interlayer insulating film 51, the etching stopper film 52, and the interlayer insulating film 53, as illustrated in FIG. 9B.

Specifically, a resist mask having an opening with a shape of wiring is formed on the interlayer insulating film 53. By using this resist mask, the interlayer insulating films 51 and 53 are subjected to the dry etching. At this time, a wiring trench 53a is first formed in the interlayer insulating film 53. When the dry etching is successively performed, the etching stopper film 52 functions as a hard mask, and a connection hole 51a whose shape follows that of the opening 52a of the etching stopper film 52 is formed in the interlayer insulating film 51. The resist mask is removed by ashing or the like. Consequently, the wiring structure trench 54 in which the connection hole 51a, the opening 52a, and the wiring trench 53a are integrated, is formed in the interlayer insulating film 51, the etching stopper film 52, and the interlayer insulating film 53.

Figure 9C:
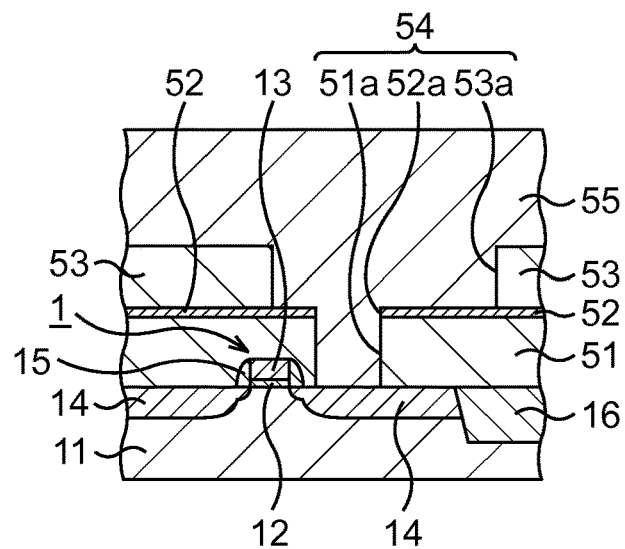

Subsequently, carbon 55 is deposited, as illustrated in FIG. 9C.

Specifically, the carbon 55 is deposited on the interlayer insulating film 53 to have a thickness of about 600 nm, for example, by the directive sputtering method or the like, so as to fill the wiring structure trench 54. Note that it is also possible to use the vapor deposition method, instead of using the sputtering method.

Figure 10A:
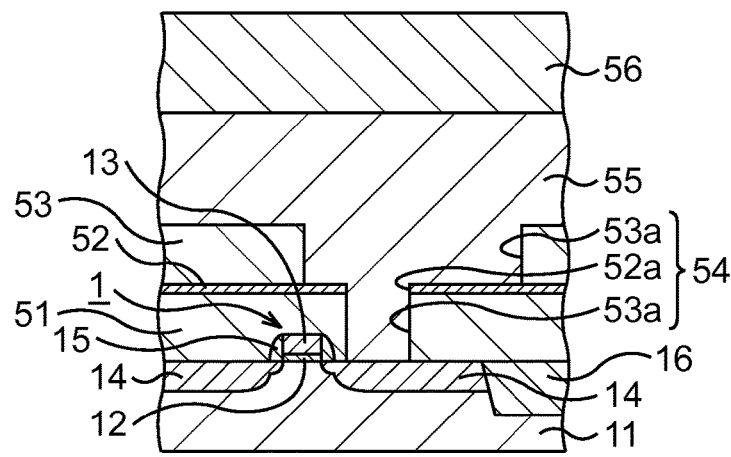
FIG. 10A, FIG. 10B, and FIG. 10C are schematic sectional views illustrating the manufacturing method of the semiconductor device according to the second embodiment in order of processes continued from FIG. 9C.

Subsequently, a catalytic metal 56 is deposited, as illustrated in FIG. 10A.

Specifically, Co, Ni, Pt, Fe or the like being a metal to be a catalyst in graphene formation, for example, Co is deposited on the carbon 55 to have a thickness of about 1000 nm, for example, by the sputtering method or the like. Consequently, the catalytic metal 56 is formed on the carbon 55.

Figure 10B:
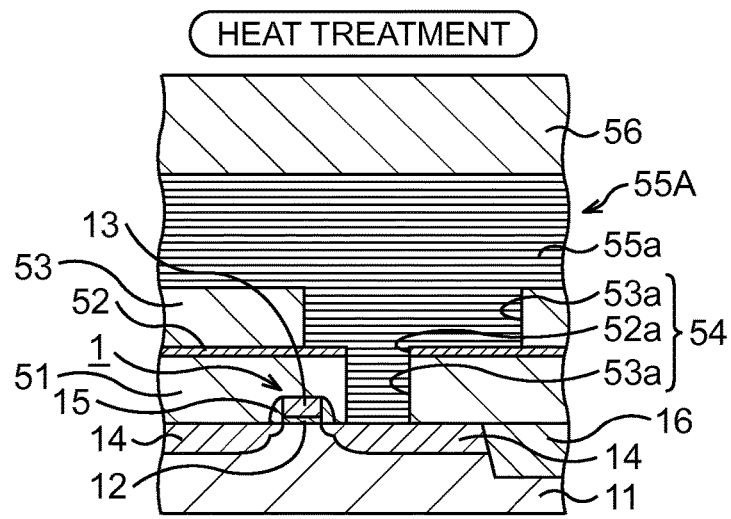

Subsequently, a multilayer graphene 55A is formed, as illustrated in FIG. 10B.

Specifically, the carbon 55 is subjected to heat treatment under a condition where a processing temperature is set to 600° C. or more, which is set to about 1200° C. in this case, and a processing time is set to from about 1 second to about 1 hour, which is set to about 20 seconds in this case by depending on the processing temperature. Accordingly, the carbon 55 is turned into the multilayer graphene 55A formed of graphenes 55a which are stacked in a plurality of layers. The multilayer graphene 55A is formed in a state where the graphenes 55a are grown in the horizontal direction along a contact surface with the catalytic metal 56 (along a bottom surface of the connection hole 51a), and sheet-shaped graphenes 55a are stacked in the plurality of layers. By this method, the multilayer graphene 55A having a resistivity corresponding to that of HOPG can be obtained.

Figure 10C:
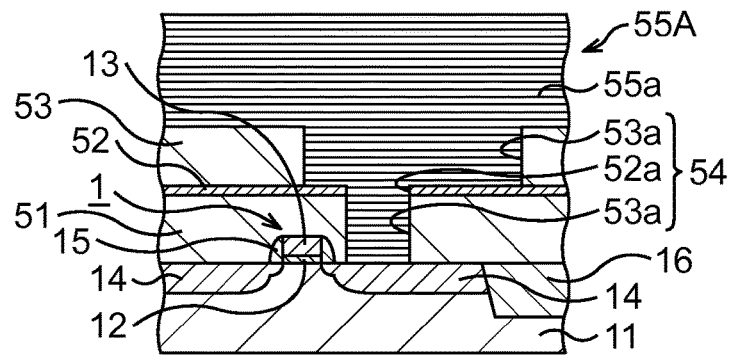

Subsequently, the catalytic metal 56 is removed, as illustrated in FIG. 10C.

Specifically, the wet etching is performed on the catalytic metal 56 by using, for example, the aqueous solution of $FeCl_3$, or the dilute aqueous solution of HCl, to thereby remove the catalytic metal 56. Note that the removal of the catalytic metal 56 may also be omitted since the catalytic metal 56 is removed also in a process of intercalation or a process of planarization to be described later.

Figure 11A:
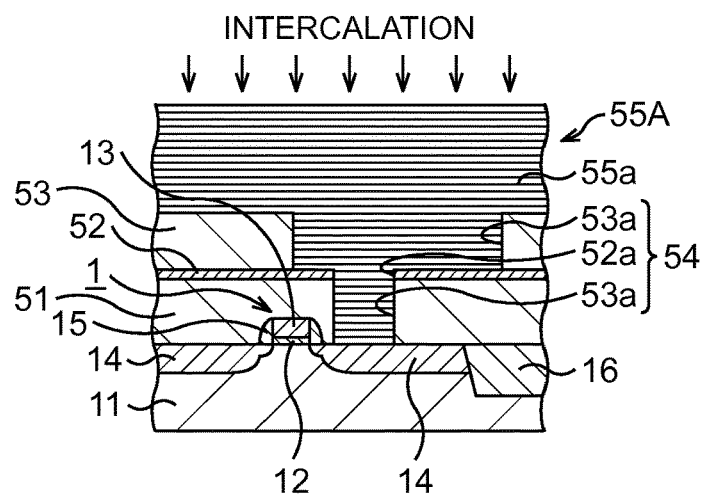
FIG. 11A, FIG. 11B, and FIG. 11C are schematic sectional views illustrating the manufacturing method of the semiconductor device according to the second embodiment in order of processes continued from FIG. 10C.

Subsequently, the intercalation (doping) is performed on the multilayer graphene 55A, as illustrated in FIG. 11A.

Specifically, the intercalation of molecules of a different kind is performed on the multilayer graphene 55A. The molecules of the different kind to be intercalated are not particularly limited, but, it is desirable to use at least one kind selected from $FeCl_3$, K, Rb, Cs, Li, $HNO_3$, $SbCl_5$, $SbF_5$, $Br_2$, $AlCl_3$, $NiCl_2$, $AsF_5$, and $AuCl_3$. Here, $FeCl_3$ is used, for example. Through this intercalation, it is possible to greatly decrease an electric resistance and a thermal resistance of the multilayer graphene 55A, and the resistivity of the multilayer graphene 55A can be decreased, from the resistivity corresponding to that of HOPG to the resistivity corresponding to that of Cu.

Figure 11B:
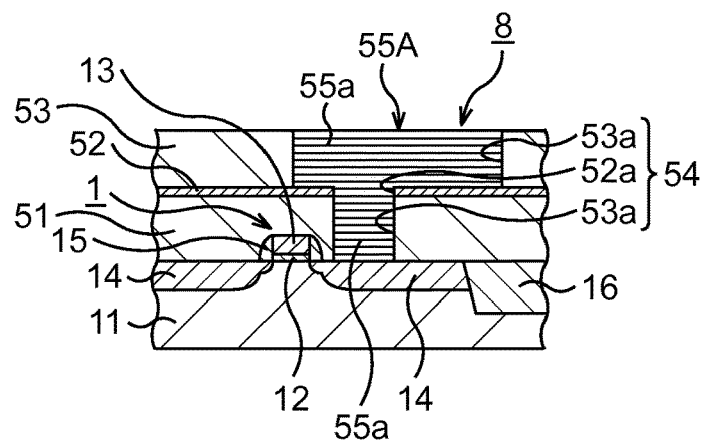

Subsequently, a part on the interlayer insulating film 53 is subjected to planarization, as illustrated in FIG. 11B.

Specifically, with the use of the CMP, for example, the multilayer graphene 55A is polished by using a surface of the interlayer insulating film 53 as a polishing stopper, to thereby perform the planarization on the part on interlayer insulating film 53. Through this planarization, the multilayer graphene 55A remains only in the wiring structure trench 54. Consequently, there is formed a wiring structure 8 made by filling the inside of the wiring structure trench 54 with the multilayer graphene 55A formed of the stacked graphenes 55a in the horizontal direction.

An adhesiveness of the multilayer graphene 55A is maintained in the wiring structure trench 54. For this reason, the wiring structure 8 is formed in a manner that the multilayer graphene 55A is directly filled in the wiring structure trench 54 with no barrier metal or the like provided therebetween.

By employing this configuration, the wiring structure 8 is formed only of the multilayer graphene 55A (and the intercalant) without using another structure material (barrier metal or the like) which causes an increase in the electric resistance and the thermal resistance, resulting in that the electric resistance and the thermal resistance of the wiring structure 8 can be decreased as much as possible.

Note that it is also possible that, in accordance with a formation state of the wiring structure, the multilayer graphene 55A is formed in the wiring structure trench 54 via the barrier metal or the contact metal.

Figure 11C:
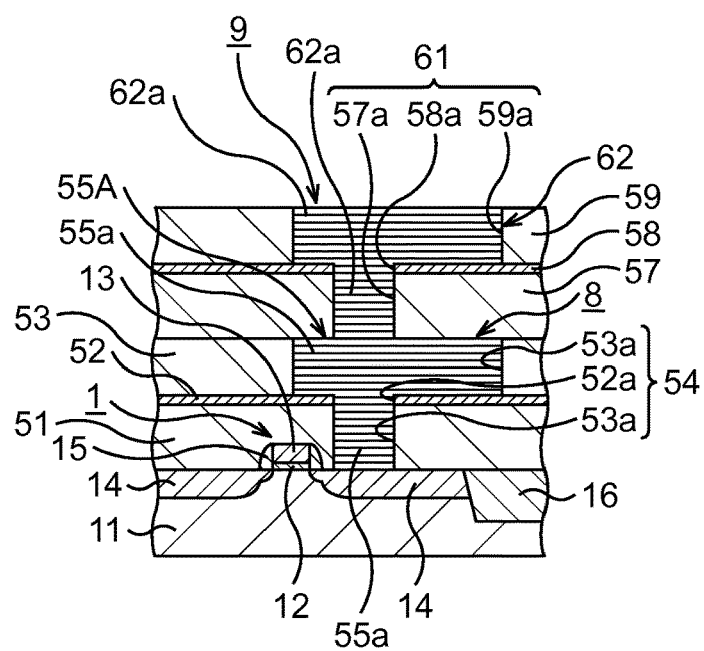

Subsequently, on the wiring structure 8, a wiring structure 9 to be connected to the wiring structure 8 is formed, as illustrated in FIG. 11C.

The wiring structure 9 is formed in a similar manner to that of the wiring structure 8.

Specifically, an interlayer insulating film 57, an etching stopper film 58 having an opening 58a, and an interlayer insulating film 59 are sequentially formed on the interlayer insulating film 53. A wiring trench 59a and a connection hole 57a are sequentially formed in the interlayer insulating film 59 and the interlayer insulating film 57, respectively. The connection hole 57a, the opening 58a, and the wiring trench 59a are integrated to be a wiring structure trench 61. Carbon which fills the wiring structure trench 61 is formed on the interlayer insulating film 59, a catalytic metal is formed on the carbon, a multilayer graphene 62 is formed by performing heat treatment on the carbon, and a removal of the catalytic metal and the CMP of the multilayer graphene 62 are carried out. Consequently, there is formed the wiring structure 9 made by filling the inside of the wiring structure trench 61 with the multilayer graphene 62 formed of stacked sheet-shaped graphenes 62a in the horizontal direction.

Hereinafter, on the wiring structure 9, wiring structures to be connected to the wiring structure 9 are sequentially formed by a necessary number, in a similar manner to that of the wiring structure 9, to thereby realize a multilayer wiring structure. Consequently, the semiconductor device is formed.

Note that in the present embodiment, the case where the multilayer wiring structure is directly formed on the MOS transistor is exemplified, but, it is also possible to design such that the multilayer wiring structure is formed in advance, and is connected to the substrate on which the MOS transistor is formed, through the transfer or the like.

As described above, according to the present embodiment, it becomes possible to easily and securely obtain the simple wiring which utilizes the excellent low electric resistance and low thermal resistance of graphene as much as possible, and the multilayer wiring structure with high reliability is realized.

According to the present embodiment, it becomes possible to easily and securely obtain a simple wiring which utilizes excellent low electric resistance and low thermal resistance of graphene as much as possible, and a wiring structure with high reliability is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A wiring structure, comprising:
   a first insulating film including a connection hole;
   a second insulating film which is on the first insulating film and includes a wiring trench;
   a first conductive material which fills an inside of the connection hole; and
   a second conductive material which fills an inside of the wiring trench, wherein
   the first conductive material is made of a first graphene layer which includes stacked plural graphenes formed in a direction along a bottom surface of the connection hole,
   the second conductive material is made of a second graphene layer which includes stacked plural graphenes formed in a direction along a bottom surface of the wiring trench, and
   the first graphene layer and the second graphene layer are directly connected to each other.

2. The wiring structure according to claim 1, wherein the first graphene layer and the second graphene layer are subjected to intercalation or doping using molecules of a different kind.

3. The wiring structure according to claim 1, wherein only the first graphene layer is formed in the inside of the connection hole of the first insulating film.

4. The wiring structure according to claim 1, wherein only the second graphene layer is formed in the inside of the wiring trench of the second insulating film.

* * * * *